United States Patent [19]
Yamanishi et al.

[11] Patent Number: 5,626,727
[45] Date of Patent: May 6, 1997

[54] SPUTTERING APPARATUS AND METHOD

[75] Inventors: Hitoshi Yamanishi, Higashiosaka; Isamu Aokura, Osaka; Masahide Yokoyama, Hirakata; Takahiro Takisawa, Moriguchi, all of Japan

[73] Assignee: Matsushita Electric Industrial Co., Ltd., Osaka-fu, Japan

[21] Appl. No.: 504,516

[22] Filed: Jul. 20, 1995

[30] Foreign Application Priority Data

Jul. 20, 1994 [JP] Japan .................................. 6-167800

[51] Int. Cl.⁶ ........................................................ C23C 14/35
[52] U.S. Cl. ........................... 204/192.12; 204/298.16; 204/298.18; 204/298.19
[58] Field of Search ........................ 204/192.12, 298.16, 204/298.18, 298.19, 298.28

[56] References Cited

U.S. PATENT DOCUMENTS 5,403,457   4/1995   Nago et al. ............................ 204/192.2

FOREIGN PATENT DOCUMENTS 3912572   11/1989   Germany ........................... 204/298.18
3-243763  10/1991   Japan .................................. 204/298.18
6-41736    2/1994   Japan .................................. 204/298.16

*Primary Examiner*—Aaron Weisstuch
*Attorney, Agent, or Firm*—Wenderoth, Lind & Ponack

[57] ABSTRACT

A sputtering apparatus uses a plurality of rectangular targets to form a thin film on a substrate, and includes a plurality of magnets disposed along both side edges of each target in such a manner that the polarities of adjacent magnets along the side edges of the targets are opposite, and polarities of the magnets confronting each other across the targets are opposite. The surfaces of at least two targets are inclined to a surface of the substrate at an angle not smaller than 30° and not larger than 60°.

21 Claims, 12 Drawing Sheets

DISTANCE FROM TARGET CENTER

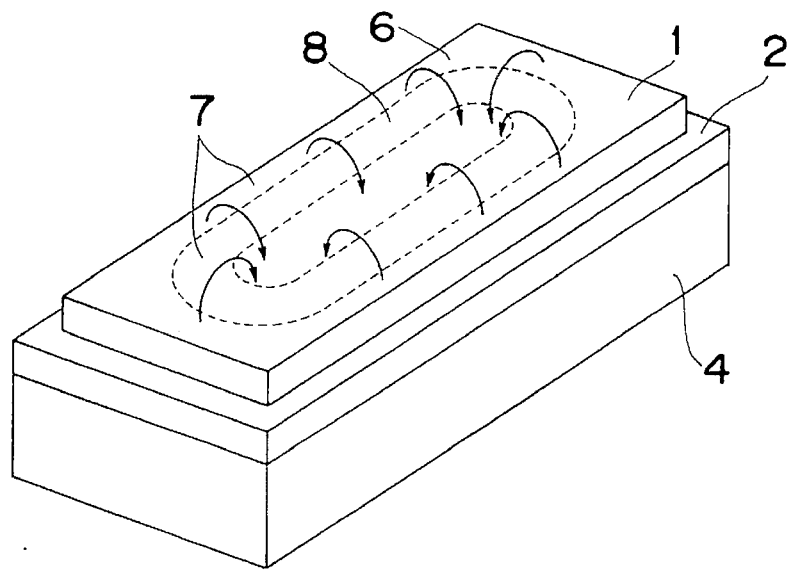
Fig. 10 PRIOR ART
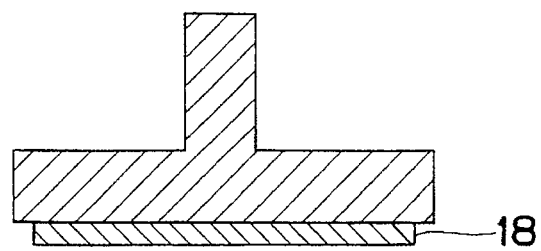
Fig. 12 PRIOR ART
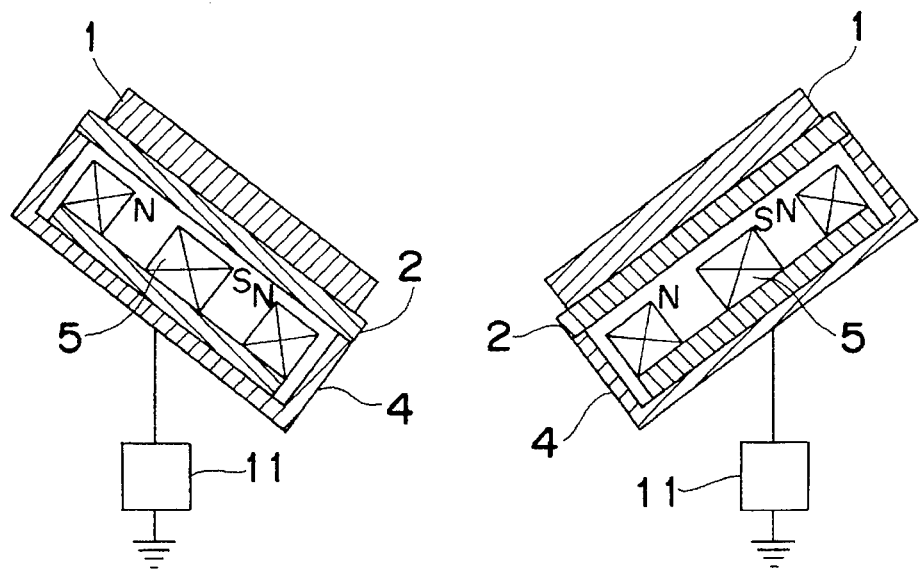

SPUTTERING APPARATUS AND METHOD

BACKGROUND OF THE INVENTION

The present invention relates to sputtering apparatus and method of a magnetron sputtering system configured to form a thin film on a large substrate using small-sized sputtering electrodes.

Sputtering facilitates formation of thin films of high melting point materials or compounds when compared to vacuum vapor deposition, and is thus widely used in industrial fields which involve processing of semiconductors, electronic components, etc. Magnetron sputtering, in which a magnetic field is formed in the vicinity of a target using permanent magnets or electromagnets, eliminates a disadvantage of sputtering in which it generally takes ten times or more longer to form a thin film than is required for vacuum vapor disposition. Magnetron sputtering thus allows for mass-production of thin films.

An electrode used in the conventional magnetron sputtering will be described with reference to FIGS. 9A, 9B, and 10.

FIG. 9A is a plan view of a conventional magnetron sputtering electrode with a rectangular flat target and FIG. 9B is a sectional view of the electrode taken along a line A–A' of FIG. 9A. FIG. 10 is a perspective view of the target of the electrode. A rectangular flat target 1 is bonded to a backing plate 2 by means of a soldering material such as indium or the like, which is set on a main body 4 via an O ring 3 disposed for the purpose of vacuum sealing. Magnets for magnetron discharge are provided at a rear side of the target 1 to form closed lines of magnetic force 6. The magnets 5 are so arranged that part of the lines of magnetic force 6 become parallel to each other at a front surface of the target 1. Due to this arrangement, on the front surface of the target 1 there is generated a closed tunnel of a toroidal magnetic field 7.

The operational principle of the magnetron sputtering electrode of the above configuration will be explained with reference to FIGS. 10 and 11.

FIG. 11 schematically shows a sputtering apparatus provided with the magnetron sputtering electrode described above.

Referring to FIG. 11, generally, a magnetron sputtering electrode 12 is placed in a vacuum chamber 9 via a sleeve of insulating material 10. When a thin film is to be formed, the vacuum chamber 9 is evacuated by a vacuum pump 13 to a high degree of vacuum, i.e., approximately $10^{-7}$ Torr. Then, a discharge gas such as Ar or the like is introduced from gas cylinder 14 into the vacuum chamber 9 through a flow rate regulator 15 to keep the chamber 9 at about $10^{-3}$–$10^{-2}$ Torr. In this state, when a negative voltage or a high frequency voltage is applied to the sputtering electrode 12, with the target 1 thereon, from a direct current power source or an alternating current power source 11, a magnetron discharge is brought about in the vicinity of the target 1 between an electric field and the toroidal magnetic field 7 formed by the magnets 5 in FIG. 10. As a result, plasma ions collide against the target 1, thereby sputtering the target 1. The sputtered particles are deposited on a substrate 18 set on a holder 17, so that a thin film is obtained on the substrate 18.

When the above-described conventional magnetron sputtering electrode is used, plasma density becomes high at areas where lines of magnetic force running parallel to the surface of the target are most intense. In other words, sputtering proceeds fast at an area 8 in FIG. 10, while other areas of the target 1 are not uniformly sputtered because of re-adhesion of sputtered particles to the target or like reasons. It is accordingly necessary to regulate the size of the target and the distance between magnets or between the target and substrate so as to obtain the desired uniformity in thickness of a thin film formed on a substrate facing the target. In general, it is necessary for the target to have one side which is approximately twice the size of the substrate to secure satisfactory film thickness uniformity.

Meanwhile, apparatuses that employ small sputtering electrodes to form a thin film on a large substrate have been applied to solve the aforementioned problem.

In one example, a plurality of flat magnetron sputtering electrodes are inclined to the large substrate 18 as shown in FIG. 12 to effectively provide film thickness uniformity on the large substrate.

In a different example of sputtering apparatus shown in FIG. 13, two kinds of targets, namely, a flat inner target 19 and an outer target 20 with an inclined surface are combined and independently controlled. A magnetic field is formed in the vicinity of the combined target by an inner electromagnetic coil 21 and an outer electromagnetic coil 22. Currents running in the two coils 21, 22 are independently controlled by a magnet power source 23, so that the magnetic field is optimized. At the same time, sputtering power fed to each target is separately controlled by a sputtering power source 11. The apparatus is intended to secure good thickness uniformity of a thin film on the large substrate 18 in this manner.

However, the target is not uniformly sputtered in the prior art apparatuses of FIGS. 12 and 13. FIGS. 14A and 14B show sectional views of the sputtered target in the example of FIG. 12, wherein the shaded parts are sputtered regions. FIG. 14A shows the state at an early stage of sputtering, FIG. 14B being a state immediately before the target becomes unusable. As is clear from FIGS. 14A and 14B, the target is not uniformly sputtered, i.e., it is sputtered differently depending on the position. Even if there remains a large amount of unsputtered regions in the target and the target is still sufficiently thick, the target is nevertheless regarded as useless when the target has locally thin portions. Consequently, the expensive target is poorly utilized.

Due to the changes in the shapes of the eroded/sputtered parts of the targets as in FIGS. 14A and 14B, the angles of incidence of the sputtered particles on the substrate are greatly different. If the power fed to the magnetic field in the vicinity of the target and electrode is kept constant both in the early stage and in the final stage of sputtering, the film thickness uniformity on the substrate is lost.

FIGS. 15A and 15B show the sputtered target in the apparatus of FIG. 13. A shaded part similarly represents a sputtered region. FIG. 15A shows the state in the early stage of sputtering, while FIG. 15B shows a state immediately before the target becomes useless.

Although the erosion of the target by sputtering also progresses considerably differently in the early stage and in the final stage in the arrangement of FIG. 13, if the currents in the coils are controlled by the magnet power source 23, the magnetic field is adjusted, whereby the film thickness uniformity can be maintained. However, the above adjustment of the magnetic field requires a complicated control means.

While the thickness uniformity can be maintained despite changes of the target with time, there is another problem in that physical properties of thin films, e.g., composition and structure of thin films are not uniform among the production lots and substrates in the case of sputtering of compounds or according to a reactive sputtering method.

SUMMARY OF THE INVENTION

The object of the present invention is therefore to provide a sputtering apparatus and method which improve uniformity in thickness and quality of a thin film formed on a large substrate by using small sputtering electrodes having rectangular flat targets, while providing a high utilization efficiency of the target.

In accomplishing these and other objects, according to one aspect of the present invention, there is provided a sputtering apparatus using a plurality of rectangular targets to form a thin film on a substrate, comprising:

a plurality of magnets disposed along either side edge of each target in such a manner that the polarities of adjacent magnets along both side edges of the target are opposite, and the polarities of the magnets confronting each other across the target are opposite, the surfaces of at least two targets being inclined to a surface of said substrate at an angle not smaller than 30° and not larger than 60°.

According to another aspect of the present invention, there is provided a sputtering method using a sputtering apparatus having a plurality of rectangular targets to form a thin film on a substrate, the apparatus comprising a plurality of magnets disposed along both side edges of each target in such a manner that the polarities of adjacent magnets along both side edges of the target are opposite, and the polarities of the magnets confronting each other across the target opposite, the surfaces of at least two targets being inclined to a surface of said substrate, the method comprising steps of:
supplying sputtering power to the targets;
forming a magnetic field by the magnets in such a manner that magnetic fluxes are formed in both directions over the entire surface of the target; and
applying magnetic forces to the plasma ions from the magnetic field in different directions, so that the ions are nearly uniformly distributed all over the surface of the target to perform sputtering thereof.

Operation of the present invention will now be described with reference to FIG. 8.

When two magnets 24 are disposed adjacent to the rectangular flat target 1 in such a manner as shown in FIG. 8, a magnetic field 25 is formed as illustrated. Ions traveling towards the target 1 receive forces which are parallel to the target surface and also parallel to the side edges of the target because of the magnetic field 25, and collide against the target 1 in a locus 27. Although the ions actually move in a spiral locus, their movement assumes on the whole the locus 27 because a negative pole of each magnet is at a side facing the target and also because of the presence of the magnetic field 25. The magnetic fluxes spread out above the target, and therefore the magnetic flux density in the vicinity of the center line 30 is smaller than in the vicinity of the magnets 24. The forces 26 applied to the ions from the magnetic fluxes before the ions collide against the target 1 are constant in strength in a direction 29. Although the plasma ions move at random and do not always arrive from above the target 1 at right angles to the target 1, the constant forces 26 applied by the magnetic field 25 make the distribution of plasma in the direction 29 uniform. By contrast, the forces 26 concentrate the plasma in the direction 28 because the forces 26 are directed approximately in a constant direction within the target surface, and therefore the rate of sputtering is increased in the direction 28 and decreased in the opposite direction.

According to the present invention, however, a plurality of magnets are arranged along both side edges of the target. The adjacent magnets are at the edges of the target are of opposite polarities to each other and moreover, the magnets confronting each other across the target are opposite to each other in polarity. Therefore, the magnetic field 25 of FIG. 8 includes magnetic fluxes in both directions on the whole of the target surface. As a result, the forces applied from the magnetic field 25 to the plasma ions moving toward the target do not operate in the same direction, so that the ions are nearly uniformly distributed all over the target surface to cause sputtering. The sputtering rate is hence generally equal all over the target surface, making the sputtered target similar to a plane surface parallel to the original surface before sputtering. The thickness irregularity of the film formed on the substrate is thus eliminated in this manner.

When the apparatus is constructed so that the ions advancing to the target can be guided to a central part of the target by the magnetic fluxes formed at side edges of the target, the plasma can be effectively utilized and the plasma density on the target can increased. The sputtering rate of the target can be also improved.

Moreover, when the apparatus is constructed so that the symmetric magnetic fluxes generated by the magnetic at both side edges of the target are opposite in direction with respect to a center line connecting mid points of the target, both sides of the target facing the center line can be eroded in a similar fashion.

When the magnetic fluxes are designed to change direction with time on a center line parallel to the side edges of the target, the uniformity in sputtering erosion can be further improved.

In the case where the target surface is parallel to the substrate surface, a thick film is formed on the substrate in the vicinity of the center of the target. The difference of the film thickness between the vicinity of the center and at a peripheral part of the target is striking when a thin film is to be formed on a large substrate of, e.g., 400 mm-length and 300 mm-width with the use of one small target. If one small target is inclined to the substrate surface, a thick film is formed on the substrate surface where the film is close to the target surface, and then where the film is separated from the target surface. On the other hand, if a plurality of inclined targets are used, the thin part of the film is thickened, whereby the film thickness is averaged all over the substrate surface. In other words, a thin film of a uniform thickness is obtainable on a large substrate even with the use of small targets if a plurality of small targets are arranged with an inclination to the substrate. In the prior art method, however, the erosion of the target does not proceed uniformly, with the consequence that the thickness irregularity is conspicuous as time goes by, and therefore it is no loner effective to use a plurality of targets. In the meantime, the arrangements of the present invention using the above described targets enable the film thickness and film quality to be more uniform even for a large substrate, without requiring a complicated control of the magnetic field.

In forming a thin film on a large rectangular substrate, the thickness irregularity is peculiar at an edge part of the substrate. The film at a central part of the substrate is thin and cannot be made thick simply by inclining targets for making the thickness of the film edge part uniform. As such, in one aspect of the present invention, some targets can be arranged in parallel to the substrate and other targets can be inclined to the substrate so as to form the film at the central part and at the edge part of the substrate, respectively. The thickness uniformity of the thin film can thereby be improved.

BRIEF DESCRIPTION OF THE DRAWINGS

These and other objects and features of the present invention will be described in conjunction with the preferred embodiments thereof with reference to the accompanying drawings, in which:

FIG. 10 is a perspective view of the conventional magnetron sputtering electrode;

FIG. 12 is a schematic diagram of a magnetron sputtering apparatus having flat targets inclined to a substrate;

DETAILED DESCRIPTION OF THE PREFERRED EMBODIMENT

Figure 1A:
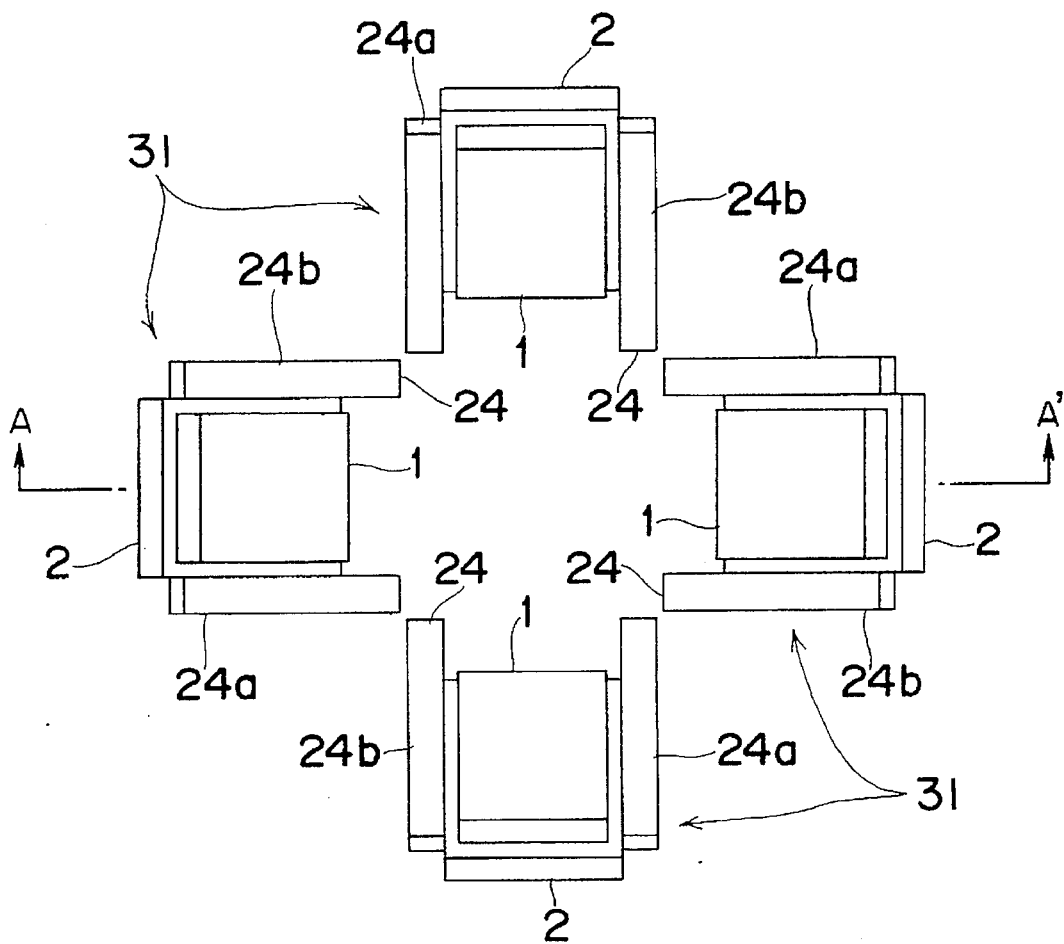
FIG. 1A is a plan view of a sputtering electrode in a first embodiment of the present invention.

Before the description of the present invention proceeds, it is to be noted that like parts are designated by like reference numerals throughout the accompanying drawings.

The sputtering apparatus and method according to a first embodiment of the present invention will be discussed hereinbelow with reference to FIGS. 1 through 5B.

Figure 1B:
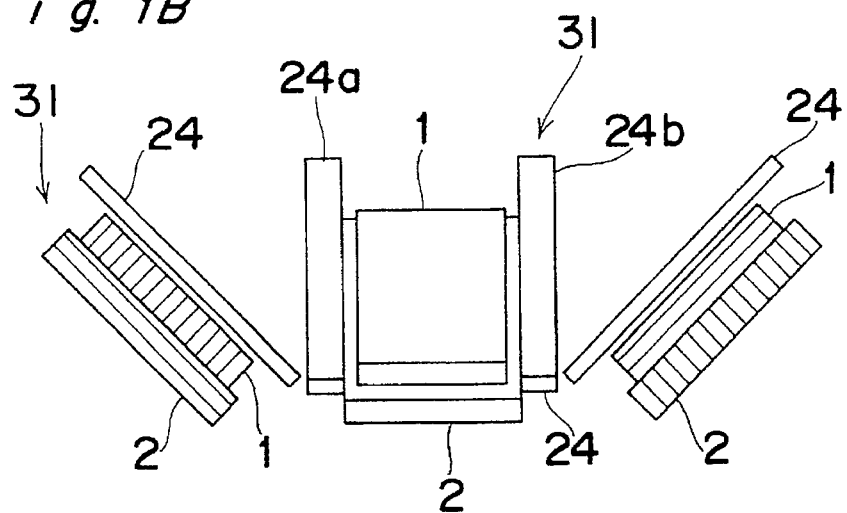
FIG. 1B is a sectional view of the electrode taken along a line A-A' of FIG. 1A.

FIG. 1A is a plan view of a sputtering electrode in a first embodiment of the present invention, and FIG. 1B is a sectional view of the electrode taken along a line A-A'. In the drawings, reference numeral 1 is a rectangular flat target, 2 a backing plate, 24 a magnet for generating a magnetic field, 24a being a left magnet, and 24b being a right magnet.

Figure 2:
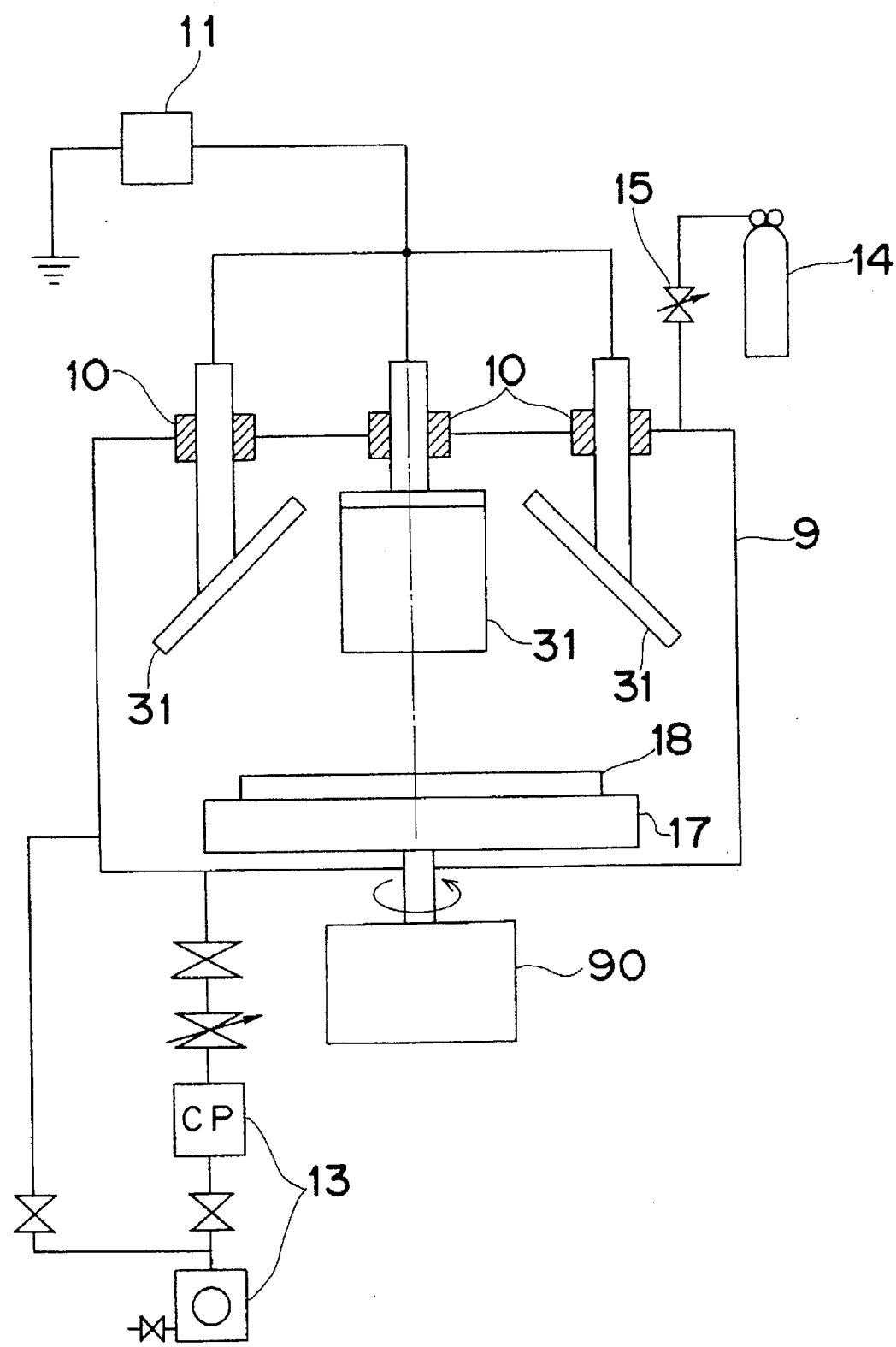
FIG. 2 is a schematic diagram of a sputtering apparatus equipped with the sputtering electrode in the embodiment.

FIG. 2 is a sputtering apparatus using the electrode of FIGS. 1A and 1B. According to the first embodiment of the present invention, there are four electrode units 31 arranged in the sputtering apparatus, each of which is inclined 45° to a substrate 18. The electrode units 32 are set in a vacuum chamber 9 via insulating members 10. A sputtering power source 11 is connected to all of the units 31. The same parts in FIG. 2 are designated by the same reference numerals as in the prior art, the description of which will be abbreviated here.

Only one of the four sputtering electrode units 31 constituting a sputtering electrode of the embodiment will be described hereinbelow with reference to FIGS. 3A, 3B, 4, 5A, and 5B. Needless to say, the same applies to the other three units.

Figure 3A:
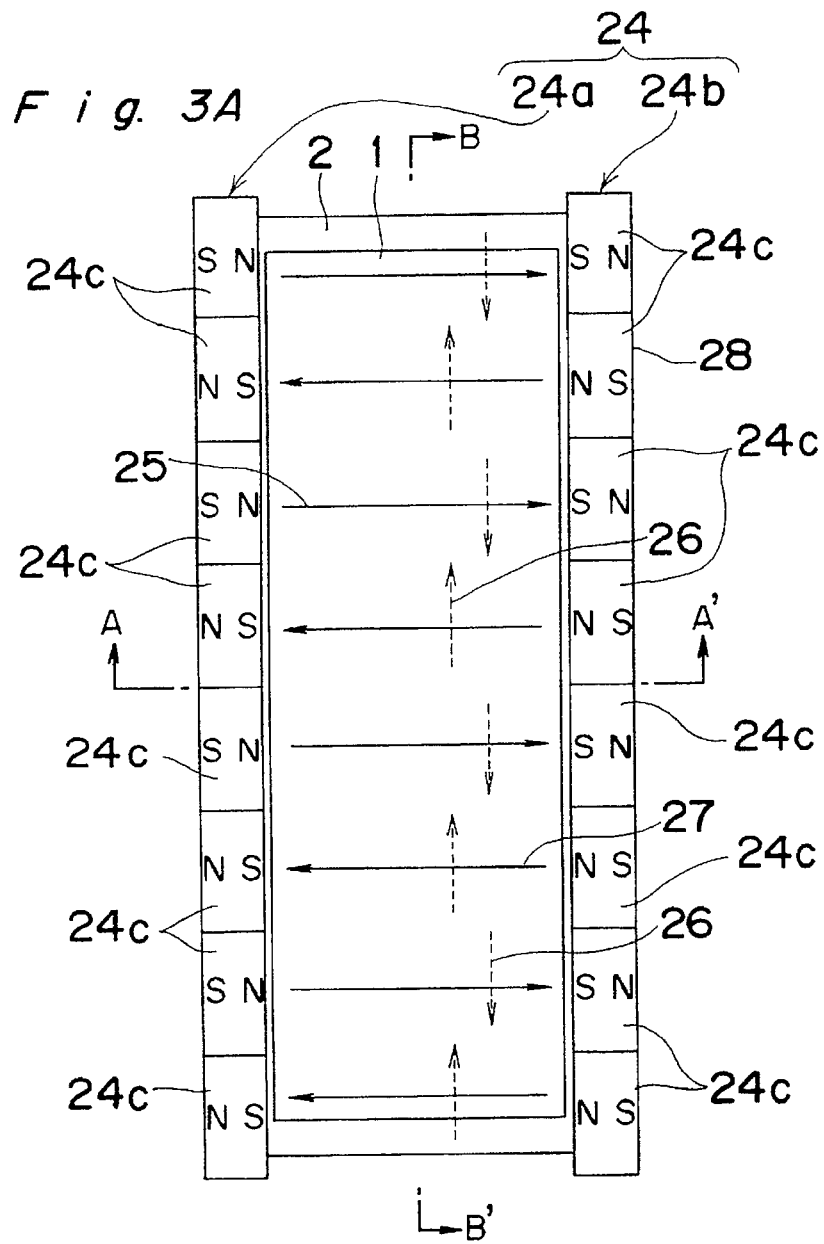
FIG. 3A is a plain view of a unit constituting the sputtering electrode in the embodiment.
Figure 3B:
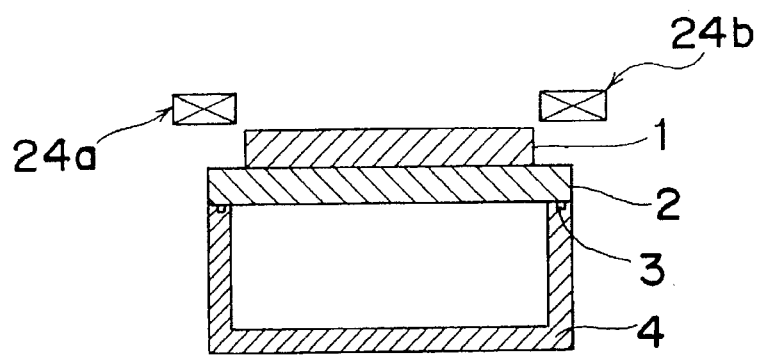
FIG. 3B is a sectional view of the unit taken along a line A-A' of FIG. 3A.

FIG. 3A is a plan view of one sputtering electrode unit 31 of the embodiment and FIG. 3B is a sectional view of the unit taken along a line A-A' of FIG. 3A.

Two groups of the magnets 24a, 24b are set in parallel to a longer axis of the target 1 respectively at right and left side edges of a front surface of the target 1. Each of the left and right groups of the magnets 24a and 24b is constituted of eight small permanent magnets 24c in such a manner that the adjacent small permanent magnets 24c are opposite in polarity. A magnetic flux 25 passes from an N pole of the right (left) magnet 24c to an S pole of the confronting left (right) magnet 24c. Plasma ions receiving a force 26 from the magnetic flux 25 move in a direction of the force 26.

Figure 4:
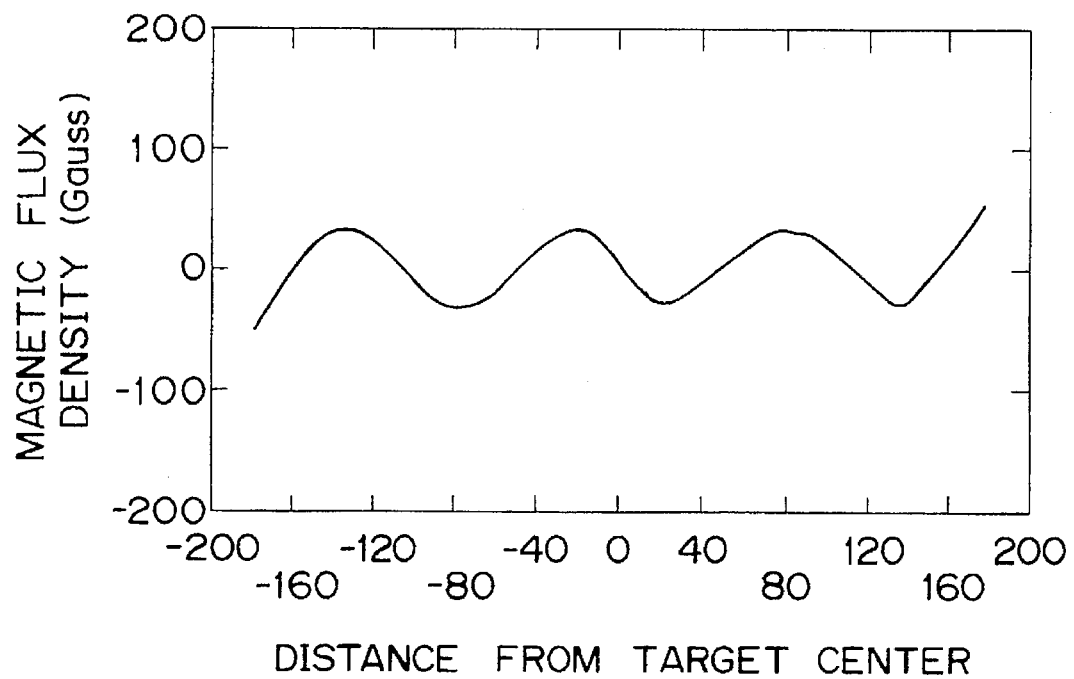
FIG. 4 is a diagram showing the distribution of a magnetic field on a target surface of the sputtering electrode unit of FIG. 3.

FIG. 4 is a diagram of the intensity of a magnetic field formed by lines of magnetic force at right angles to the longer axis of the target 1 and parallel to the surface of the target 1 taken along a line B-B' in FIG. 3A. A magnetic flux density along the of ordinate in FIG. 4 is defined by a positive value when the magnetic flux 25 flows from the left magnet 24c (N pole) to the right magnet 24c (S pole), and as a negative value when the magnetic flux 25 runs in the opposite direction, namely, from the right magnet 24c (N pole) to the left magnet 24c (S pole). At the same time, a distance from a center of the target 1 to a side B in FIG. 3A is a positive value, while that at a side B' is a negative value, the center line of the target 1 being zero.

According to the embodiment, an electrode consisting of the above-described four electrode units 31 is arranged to be inclined 45° to the substrate 18, as shown in FIG. 2. The sputtering apparatus of the embodiment equipped with the four sputtering electrode units 31 operates in the same manner as the conventional magnetron sputtering apparatus, and therefore the description thereof will be abbreviated.

Figure 5A:
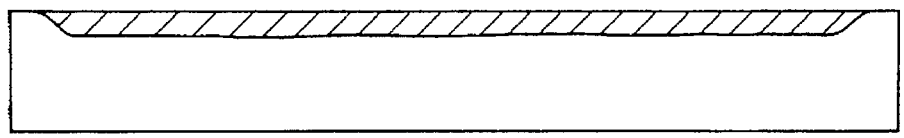
FIG. 5A is a sectional view of the target of the sputtering electrode unit of FIG. 3A at an early stage of erosion.
Figure 5B:
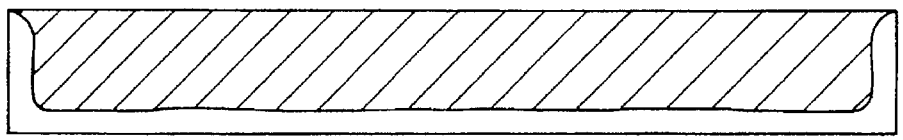
FIG. 5B is a sectional view of the target of the sputtering electrode unit of FIGS. 3A and 3B at a final stage of erosion.

In order to carry out sputtering, since the two groups of the magnets 24a and 24b of every electrode unit 31 of FIG. 3A are arranged in parallel to the longer axis of the target 1 at two opposite side edges of the surface of the target 1, the magnetic fluxes 25 pass all over the whole surface of the target 1 horizontally at right angles to the longer axis of the target 1. Moreover, since the magnets 24c are so disposed that the symmetric magnetic fluxes 25 formed by the magnets 24c are alternately reversed in direction with respect to the line A–A', that is, the magnetic fluxes 25 become point-symmetric to a central point of the target 1, generated plasma is not concentrated in one direction, but becomes symmetric to the line A–A'. The hatched areas of FIGS. 5A and 5B represent an erosion of the target shown in section along the line B–B' of FIG. 3A. Specifically, FIG. 5A indicates the erosion at an early stage and FIG. 5B indicates the erosion at a final stage. The ended target surface is eroded to be nearly parallel to the original surface even when the sputtering proceeds to the degree shown in FIG. 5B. In other words, the target is eroded almost uniformly all over the surface thereof without a large change in shape of the eroded surface both in the early stage and in the final stage of sputtering. There is hardly any change of the thickness distribution with time and physical properties of the thin film, for example, composition and structure of the thin film.

Since the four sputtering electrode units 31 of the target 1 are inclined 45° to the substrate 18 as indicated in FIG. 2, the thickness uniformity of the thin film on the large substrate 18 is secured by the small sputtering apparatus. If the substrate holder 17 is made to revolve by a means 90 for rotating the substrate 18 such as a motor, the thickness uniformity and quality uniformity of the film within the substrate surface are furthermore improved.

According to the first embodiment as above, since the four sputtering electrode units 31 of uniformly sputtered targets 1 are inclined an optimum angle to the substrate 18, a thin film of stable film thickness and stable film quality can be formed from the early stage to the end of sputtering in the small sputtering apparatus.

Referring back to FIG. 3A, the magnetic flux 25 in the vicinity of one end of the target 1 (upper end in FIG. 3A) is directed to the right, a downward force 26 is applied to ions approaching the target 1 in a direction perpendicular to the plane of the drawing. On the other hand, the leftward directed magnetic flux 25 at the other end of the target 1 (lower end in FIG. 3A) applies an upward force 26 to the same ions. As a result of this, the plasma on the target surface is enclosed, thus increasing the density of the plasma and consequently increasing the sputtering rate and film forming-speed.

The sputtering apparatus and method according to a second embodiment of the present invention will be now described with reference to the corresponding drawings.

Figure 6A:
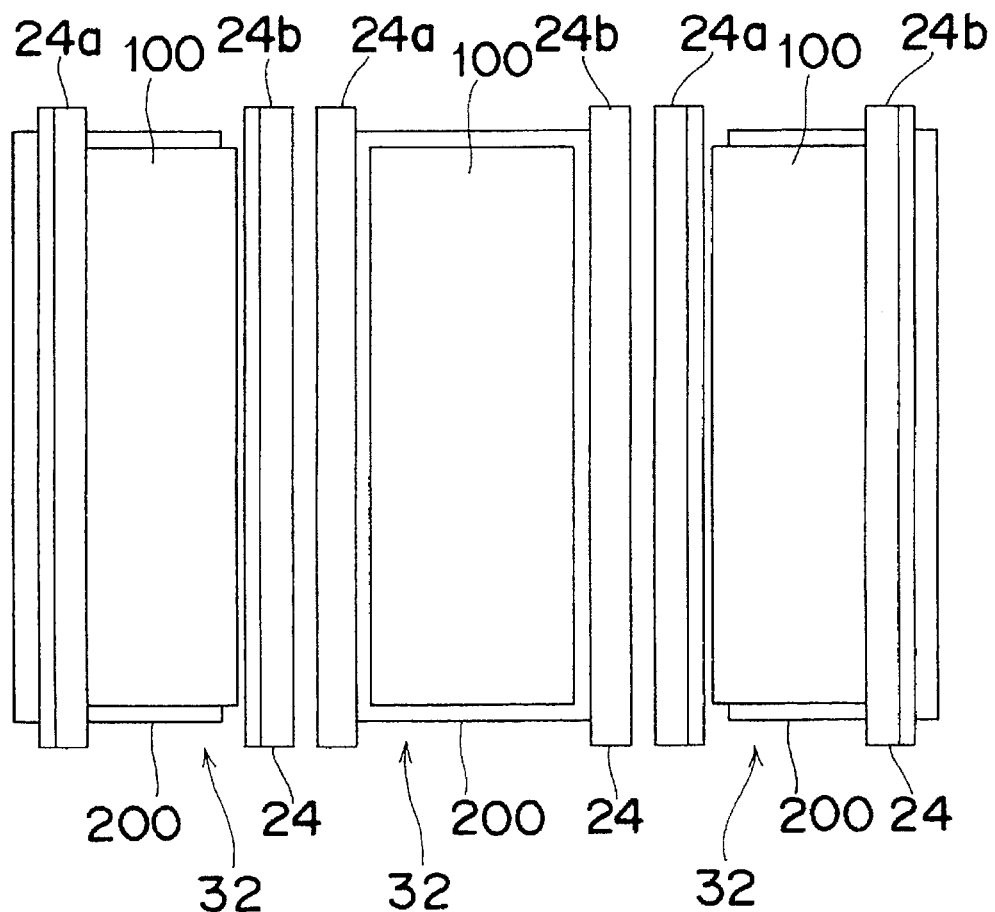
FIG. 6A is a plan view of a sputtering electrode in a second embodiment of the present invention.
Figure 6B:
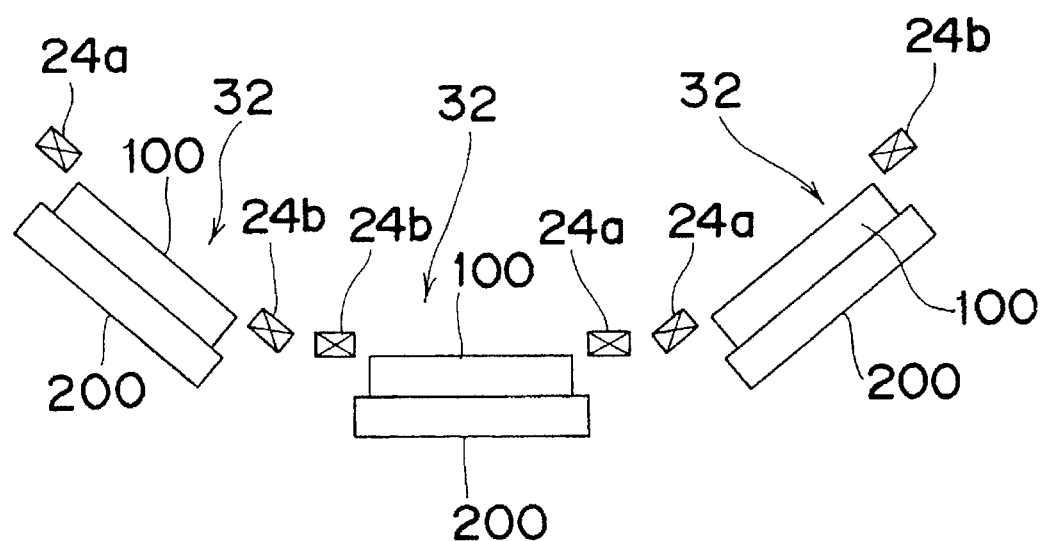
FIG. 6B is a front view of the sputtering electrode of FIG. 6A.
Figure 7:
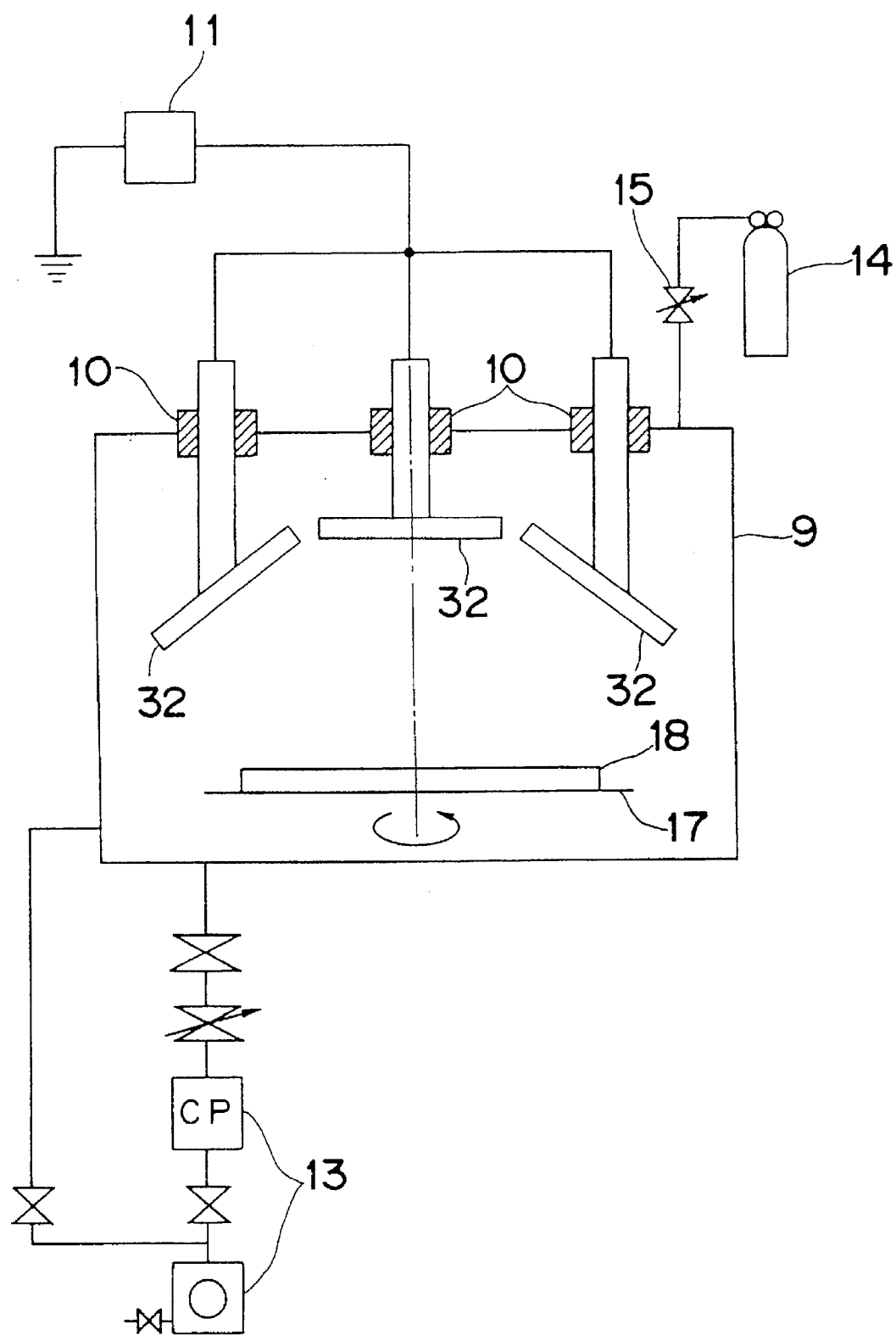
FIG. 7 is a schematic diagram of a sputtering apparatus provided with the sputtering electrode in the second embodiment.
Figure 8:
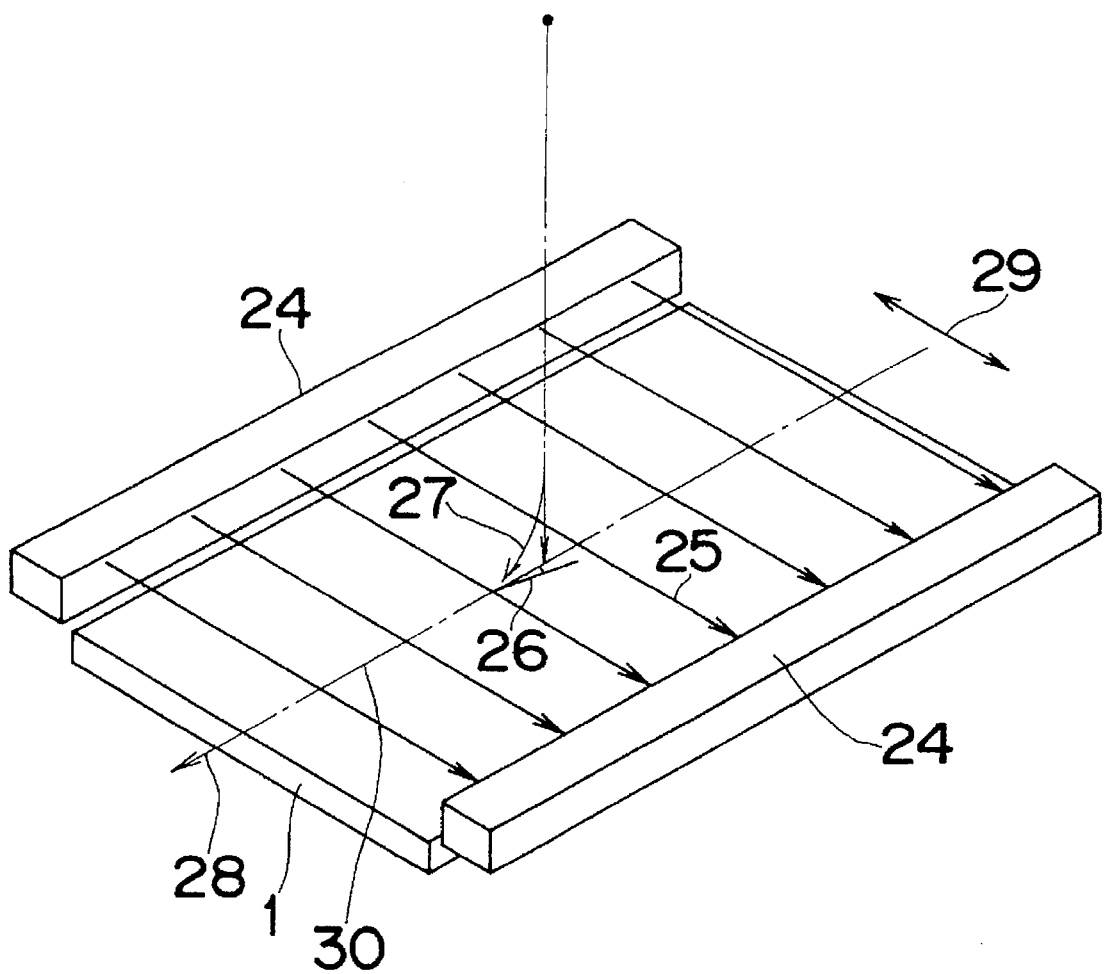
FIG. 8 is a diagram showing the forces applied to ions from a magnetic field.
Figure 9A:
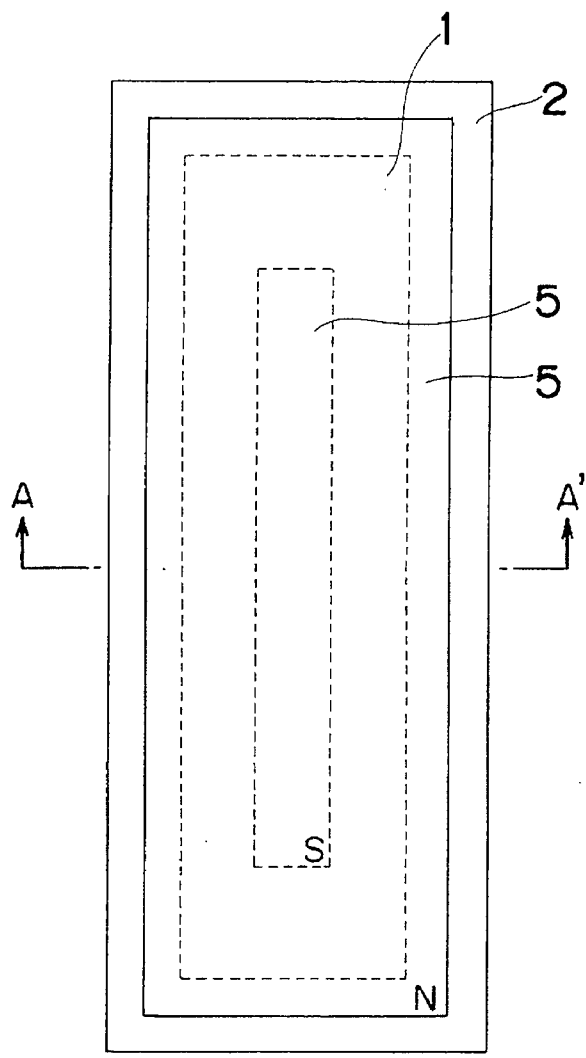
FIG. 9A is a plan view of a conventional magnetron sputtering electrode.
Figure 9B:
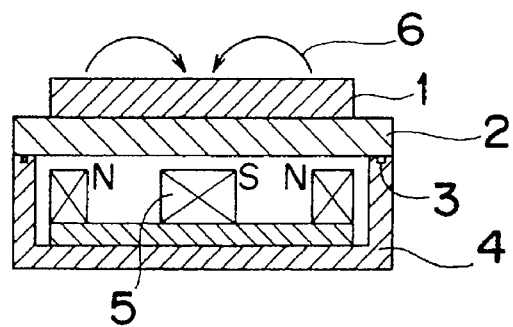
FIG. 9B is a sectional view of the electrode of FIG. 9A taken along a line A-A' of FIG. 9A.
Figure 11:
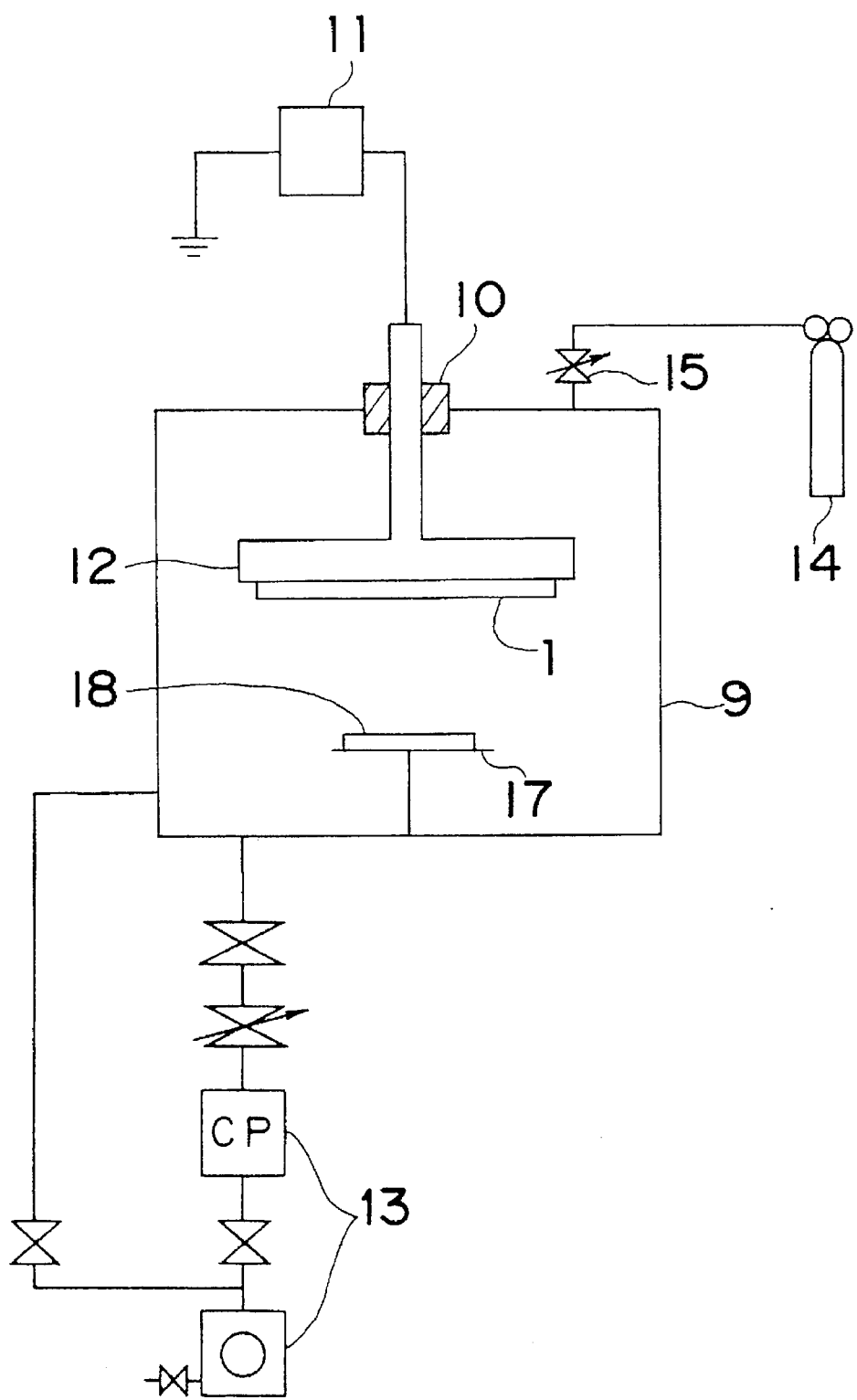
FIG. 11 is a schematic diagram of a sputtering apparatus provided with the conventional magnetron sputtering electrode.
Figure 13:
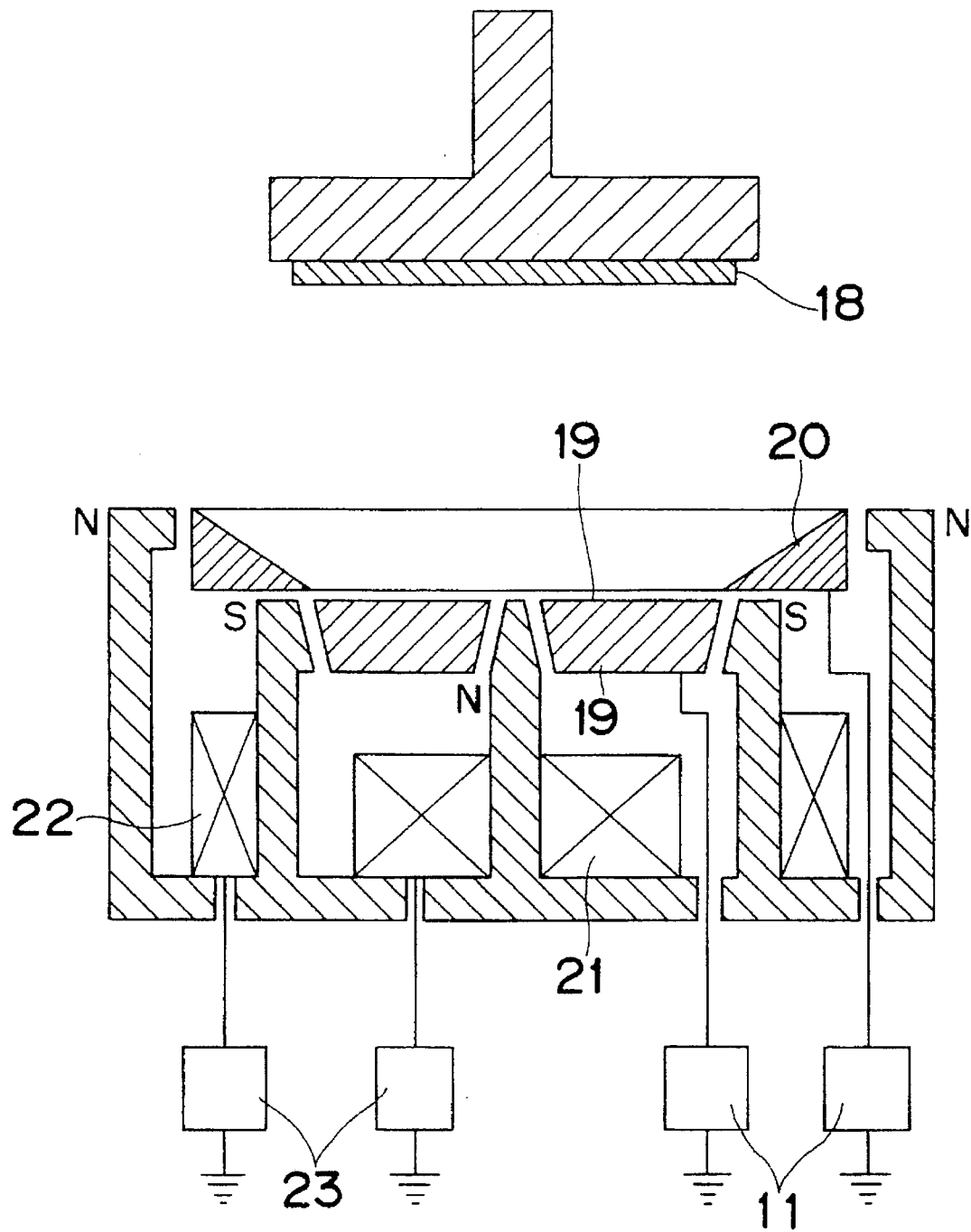
FIG. 13 is a schematic diagram of a magnetron sputtering apparatus having inner and outer targets.
Figure 14A:
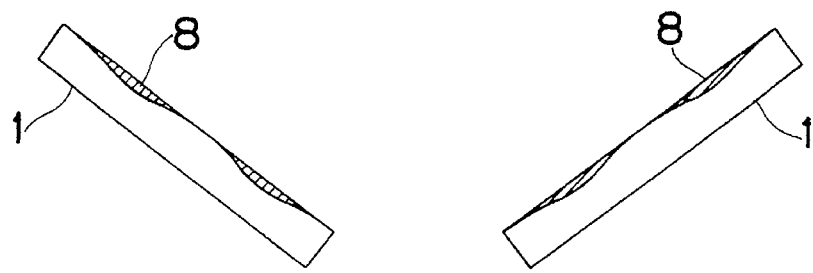
FIG. 14A is a sectional view of the target of FIG. 12 at an early stage of sputtering.
Figure 14B:
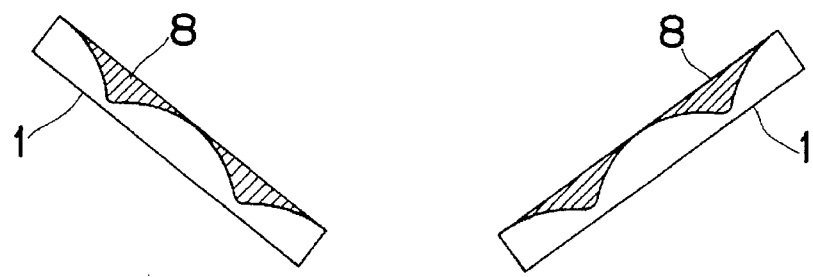
FIG. 14B is a sectional view of the target of FIG. 12 at a final stage of sputtering.
Figure 15A:
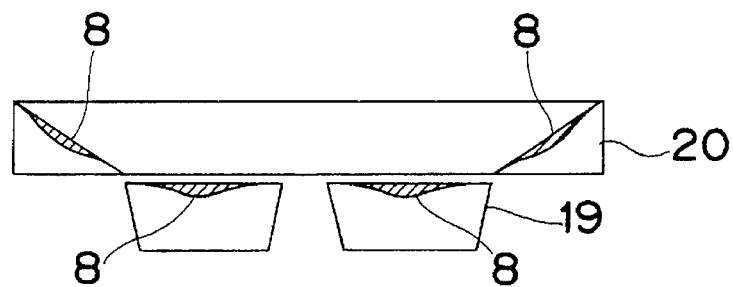
FIG. 15A is a sectional view of the target of FIG. 13 at an early stage of sputtering.
Figure 15B:
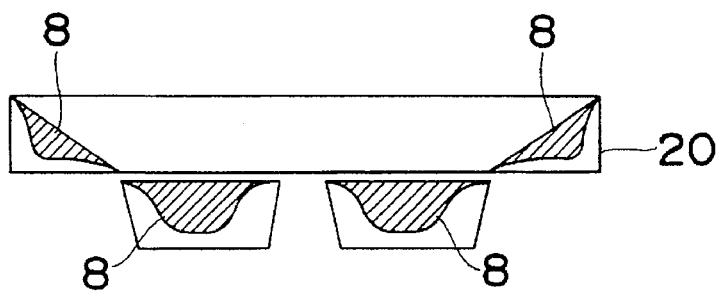
FIG. 15B is a sectional view of the target of FIG. 13 at a final stage of sputtering.

FIG. 6A is a plan view of a sputtering electrode in the second embodiment. FIG. 6B is a front view of the sputtering electrode of FIG. 6A. In the drawings, reference numerals 100, 200, and 24 are respectively a rectangular flat target, a backing plate, and a magnet for generating a magnetic field. In the second embodiment, three sputtering electrode units 32 of the same constitution as the units 31 of FIG. 3A are employed, which are set, similarly to the first embodiment, in the vacuum via the insulating members 10 as shown in FIG. 7. Each unit 32 is connected to the sputtering power source 11.

In the second embodiment, two of the three targets 1 provided with the sputtering electrode units 32 and sputtered uniformly over nearly all the surfaces thereof are inclined 45° to the substrate 18, and the central target 1 is set parallel to the substrate 18. The substrate 18 used in the second embodiment is a large rectangular plate and is not allowed to rotate, unlike the first embodiment. Since the film forming speed at the central part of the substrate 18 is slow while the speed at the edges of the substrate 18 is fast, one electrode unit 32 is set parallel to the substrate 18 so as to average the film forming speeds. For each sputtering electrode unit 32 configured as in FIG. 3A, particles sputtered from the electrode unit 32 behave uniformly, so that the thickness and quality of the thin film formed on the substrate 18 are stable from the start to the end of sputtering.

Although the eight permanent magnet pieces are disposed at both side edges of the target 1 to constitute a magnetic circuit in the first and second embodiments, any number of magnet pieces may be used so long as the magnetic flux density is symmetric with respect to the center of the target and the lines of magnetic force are opposite in direction to the center of the target. The greater the number of magnet pieces, the more uniformly the target surface is eroded. The magnetic circuit may be constituted of electromagnets rather than the permanent magnets.

In the foregoing embodiments, a plurality of sputtering electrode units are simply connected to one sputtering power source. However, a separate sputtering power source may be provided for each unit, or the electric power ratio may be controlled among the units.

As is described hereinabove, according to the present invention, the target is uniformly sputtered to thereby improve the uniformity of thickness and quality of the thin film formed on the substrate. Moreover, the target which is expensive is fully utilized, the utilization efficiency thus being improved.

Since at least two or more targets are inclined at an angle not smaller than 30° and not larger than 60° to the substrate, a thin film of uniform thickness and quality is formed even on a large substrate without complicated control. The sputtering apparatus is compact and cost saving, and allows its area for installation to be reduced, and the utilization efficiency of the target is improved.

In the embodiments, the inclination angles of the targets may be different from each other. In this case, it is preferable that the substrate 18 is rotated by the rotating means 90 during sputtering.

Although the present invention has been fully described in connection with the preferred embodiments thereof with reference to the accompanying drawings, it is has been fully to be noted that various changes and modifications are apparent to those skilled in the art. Such changes and modifications are to be understood as included within the scope of the present invention as defined by the appended claims unless they depart therefrom.

What is claimed is:

1. A sputtering apparatus using a plurality of rectangular targets to form a thin film on a substrate, comprising:

a plurality of magnets disposed along both side edges of each target in such a manner that the polarities of adjacent magnets along the side edges of the target are opposite, and the polarities of the magnets confronting each other across the target are opposite, the surfaces of at least two said targets being inclined to a surface of said substrate at an angle not smaller than 30° and not larger than 60°.

2. The sputtering apparatus as claimed in claim 1, wherein the magnets are so arranged that the magnetic fluxes at the side edges of each target guide plasma ions approaching the target to central parts of the targets.

3. The sputtering apparatus as claimed in claim 2, wherein symmetric magnetic fluxes generated by said magnets at the side edges of each target are opposite in direction to a center line connecting midpoints of the side edges of the target.

4. The sputtering apparatus as claimed in claim 2, wherein magnetic fluxes generated by said magnets at the side edges of each target change polarities with time on a center line parallel to the side edges of the target.

5. The sputtering apparatus as claimed in claim 1, wherein symmetric magnetic fluxes generated by said magnets at the side edges of each target are opposite in direction to a center line connecting midpoints of the side edges of the target.

6. The sputtering apparatus as claimed in claim 5, wherein magnetic fluxes generated by said magnets at the side edges of each target change polarities with time on a center line parallel to the side edges of the target.

7. The sputtering apparatus as claimed in claim 1, wherein magnetic fluxes generated by said magnets at the side edges of each target change polarities with time on a center line parallel to the side edges of the target.

8. The sputtering apparatus as claimed in claim 1, wherein three said targets are arranged such that the surface of one of the three targets which is arranged between the other targets is parallel to the surface of the substrate.

9. The sputtering apparatus as claimed in claim 1, further comprising a means for rotating the substrate during the forming of the film on the substrate.

10. The sputtering apparatus as claimed in claim 1, wherein the inclination angles of the targets are different from each other.

11. A sputtering method using a sputtering apparatus including a plurality of rectangular targets to form a thin film on a substrate, the apparatus comprising a plurality of magnets disposed along both side edges of each target in such a manner that the polarities of adjacent magnets along the side edges of the target are opposite, and the polarities of the magnets confronting each other across the target are opposite, the surfaces of at least two targets being inclined to a surface of said substrate, said method comprising steps of:
supplying sputtering power to the targets;
forming magnetic fields by the magnets in such a manner that magnetic fluxes are present in both directions over an entire surface of the target; and
applying magnetic forces to the plasma ions from the magnetic field in different directions, so that the ions are nearly uniformly distributed all over the surface of the target to perform sputtering thereof.

12. The sputtering method as claimed in claim 11, wherein the surfaces of at least two said targets are inclined at angles not smaller than 30° and not larger than 60° to the surface of said substrate.

13. The sputtering method as claimed in claim 11, wherein the magnets are so arranged that magnetic fluxes at the side edges of each target guide plasma ions approaching the target to central parts of the targets.

14. The sputtering method as claimed in claim 13, wherein symmetric magnetic fluxes generated by said magnets at the side edges of each target are opposite in direction to a center line connecting midpoints of the side edges of the target.

15. The sputtering method as claimed in claim 13, wherein magnetic fluxes generated by said magnets at the side edges of each target change polarities with time on a center line parallel to the side edges of the target.

16. The sputtering method as claimed in claim 11, wherein symmetric magnetic fluxes generated by said magnets at the side edges of each target are opposite in direction to a center line connecting midpoints of the side edges of the target.

17. The sputtering method as claimed in claim 16, wherein magnetic fluxes generated by said magnets at the side edges of each target change polarities with time on a center line parallel to the side edges of the target.

18. The sputtering method as claimed in claim 11, wherein magnetic fluxes generated by said magnets at the side edges of each target change polarities with time on a center line parallel to the side edges of the target.

19. The sputtering method as claimed in claim 11, wherein three said targets are arranged such that a surface of one of the three targets which is arranged between the other targets is parallel to the surface of the substrate.

20. The sputtering method as claimed in claim 11, wherein the substrate is rotated during the sputtering.

21. The sputtering method as claimed in claim 11, wherein inclination angles of the targets are different from each other.

* * * * *